United States Patent
Schultz

(10) Patent No.: US 11,443,916 B2
(45) Date of Patent: Sep. 13, 2022

(54) THIN PELLICLE MATERIAL FOR PROTECTION OF SOLID-STATE ELECTRON DETECTORS

(71) Applicant: KLA Corporation, Milpitas, CA (US)

(72) Inventor: William G. Schultz, San Jose, CA (US)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 17/197,124

(22) Filed: Mar. 10, 2021

(65) Prior Publication Data
US 2021/0327676 A1 Oct. 21, 2021

Related U.S. Application Data

(60) Provisional application No. 63/010,074, filed on Apr. 15, 2020.

(51) Int. Cl.
*H01J 37/244* (2006.01)
*H01J 37/30* (2006.01)

(52) U.S. Cl.
CPC ........ *H01J 37/244* (2013.01); *H01J 37/3007* (2013.01); *H01J 2237/0203* (2013.01); *H01J 2237/24475* (2013.01)

(58) Field of Classification Search
CPC ............... H01J 37/244; H01J 37/3007; H01J 2237/0203; H01J 2237/24475
See application file for complete search history.

(56) References Cited

U.S. PATENT DOCUMENTS

| | | | |
|---|---|---|---|
| 2010/0102223 A1* | 4/2010 | Albiez | H01J 37/3056 250/307 |
| 2013/0048830 A1* | 2/2013 | Papadakis | B82Y 15/00 977/939 |
| 2013/0087705 A1* | 4/2013 | Hiura | G01N 23/2251 250/307 |
| 2014/0225094 A1* | 8/2014 | Fraboni | G01T 1/24 438/82 |
| 2016/0071685 A1* | 3/2016 | Kawanishi | H01J 37/20 250/396 R |
| 2016/0091787 A1* | 3/2016 | Kirkpatrick | B29C 39/203 428/137 |
| 2016/0225582 A1* | 8/2016 | Schultz | G03F 1/86 |
| 2019/0129300 A1* | 5/2019 | Ono | G03F 7/70033 |
| 2020/0401038 A1* | 12/2020 | Kawashima | G03F 1/62 |

FOREIGN PATENT DOCUMENTS

| | | |
|---|---|---|
| JP | 2014049236 A | 3/2014 |
| KR | 20170071652 A | 6/2017 |

OTHER PUBLICATIONS

WIPO, ISR for International Application No. PCT/US2021/026937, dated Aug. 6, 2021.

* cited by examiner

*Primary Examiner* — David A Vanore
(74) *Attorney, Agent, or Firm* — Hodgson Russ LLP

(57) ABSTRACT

An electron beam system and method are provided. The system includes a detector having a detector face configured to detect back-scattered electrons reflected off of a sample. The system further includes an annular cap disposed on the detector face, and a protective pellicle disposed on the annular cap, covering the detector face. The protective pellicle is transparent to back-scattered electrons and provides a physical barrier to particles directed at the detector face.

15 Claims, 4 Drawing Sheets

THIN PELLICLE MATERIAL FOR PROTECTION OF SOLID-STATE ELECTRON DETECTORS

CROSS-REFERENCE TO RELATED APPLICATIONS

This application claims priority to the provisional patent application filed Apr. 15, 2020 and assigned U.S. App. No. 63/010,074, the disclosure of which is hereby incorporated by reference.

FIELD OF THE DISCLOSURE

This disclosure relates to electron detectors and, more particularly, to a protective material for an electron detector.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Solid state electron detectors, also described as avalanche photo-detectors or APDs, may be used for certain inspection processes. An APD may be an annular assembly that permits a primary electron beam to pass through to the sample or target plane. A vertical voltage gradient may be applied across the semiconductor material. Charged particles may cause current flow from the detector face (Vo) to the biased surface (V+), which may be >100 V. The primary beam (which may range from hundreds to thousands of eV energy) may generate back-scattered electrons or "BSEs" during their interaction with the sample material. The number of BSEs detected may be related to the energy of the primary beam, the primary beam current, and to the composition of the sample material. When the primary beam penetrates an atom to its nucleus, the electron is elastically scattered or reflected through the material. Higher atomic number targets yield more backscattered electron current, where the electrons emerge in a cosine distribution.

Primary electrons can be decelerated by applying a negative bias to the target or sample plane. This bias may be varied to select the electron landing energy, and may range from positive applied voltages, 0 applied volts, or negative applied volts. In addition to changing primary electron beam landing energy, the sample bias serves to change the energy of the returning BSEs. A strong bias, when applied to the sample, can electrostatically dislodge particles, or under extreme conditions can result in delamination of the sample. Once dislodged, these particles carry the charge of the sample as well as high thermal energy. When massive particles (compared to an energetic electron) strike the APD, they become fused to the detector surface, and their charge is released as a huge current spike. The current spike can result in local damage, the creation of high leakage currents or even dead shorts across the detector.

Therefore, what is needed is a protective element for a detector and, more particularly, a protective element that can protect the detector from kinetic and thermal energy and electrical charge.

BRIEF SUMMARY OF THE DISCLOSURE

An embodiment of the present disclosure provides an electron beam system. The system may comprise a detector comprising a detector face configured to detect back-scattered electrons reflected off of a sample. The system may further comprise an annular cap disposed on the detector face, and a protective pellicle disposed on the annular cap, covering the detector face. The protective pellicle may be transparent to back-scattered electrons and provides a physical barrier to particles directed at the detector face.

According to an embodiment of the present disclosure, the protective pellicle may be monoatomic.

According to an embodiment of the present disclosure, the protective pellicle may be graphene or a graphene analog.

According to an embodiment of the present disclosure, the protective pellicle may be an electrical conductor, configured to drain charge from particles directed at the detector face intercepted by the protective pellicle.

According to an embodiment of the present disclosure, the protective pellicle may be a thermal conductor, configured to dissipate heat from particles directed at the detector face intercepted by the protective pellicle.

According to an embodiment of the present disclosure, the detector face may be annular, such that an electron beam may pass through the center of the detector face toward the sample. The protective pellicle may include an aperture, such that the electron beam may pass through the aperture toward the sample.

According to an embodiment of the present disclosure, the system may further comprise an electron beam source configured to direct an electron beam toward the sample.

An embodiment of the present disclosure provides a method. The method may comprise generating an electron beam using an electron beam source. The method may further comprise directing the electron beam toward a surface of a sample. The method may further comprise generating back-scattered electrons and particles at the surface of the sample based on interaction between the electron beam and the sample, the back-scattered electrons and particles being emitted away from the surface of the sample. The method may further comprise detecting the back-scattered electrons on a detector face of a detector. The method may further comprise preventing the particles from reaching the detector face by a protective pellicle, the protective pellicle being disposed on an annular cap on the detector face, transparent to the back-scattered electrons, and providing a physical barrier to the particles directed at the detector face.

According to an embodiment of the present disclosure, the protective pellicle may be an electrical conductor, and the method may further comprise draining charge from the particles directed at the detector face intercepted by the protective pellicle.

According to an embodiment of the present disclosure, the protective pellicle may be a thermal conductor, and the method may further comprise dissipating heat from the particles directed at the detector face intercepted by the protective pellicle.

According to an embodiment of the present disclosure, detector face may be annular, and directing the electron beam toward a surface of a sample may comprise directing the electron beam toward the surface of the sample through the detector face. The protective pellicle may include an aperture, and directing the electron beam toward a surface of a sample may further comprise directing the electron beam toward the surface of the sample through the aperture of the protective pellicle.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
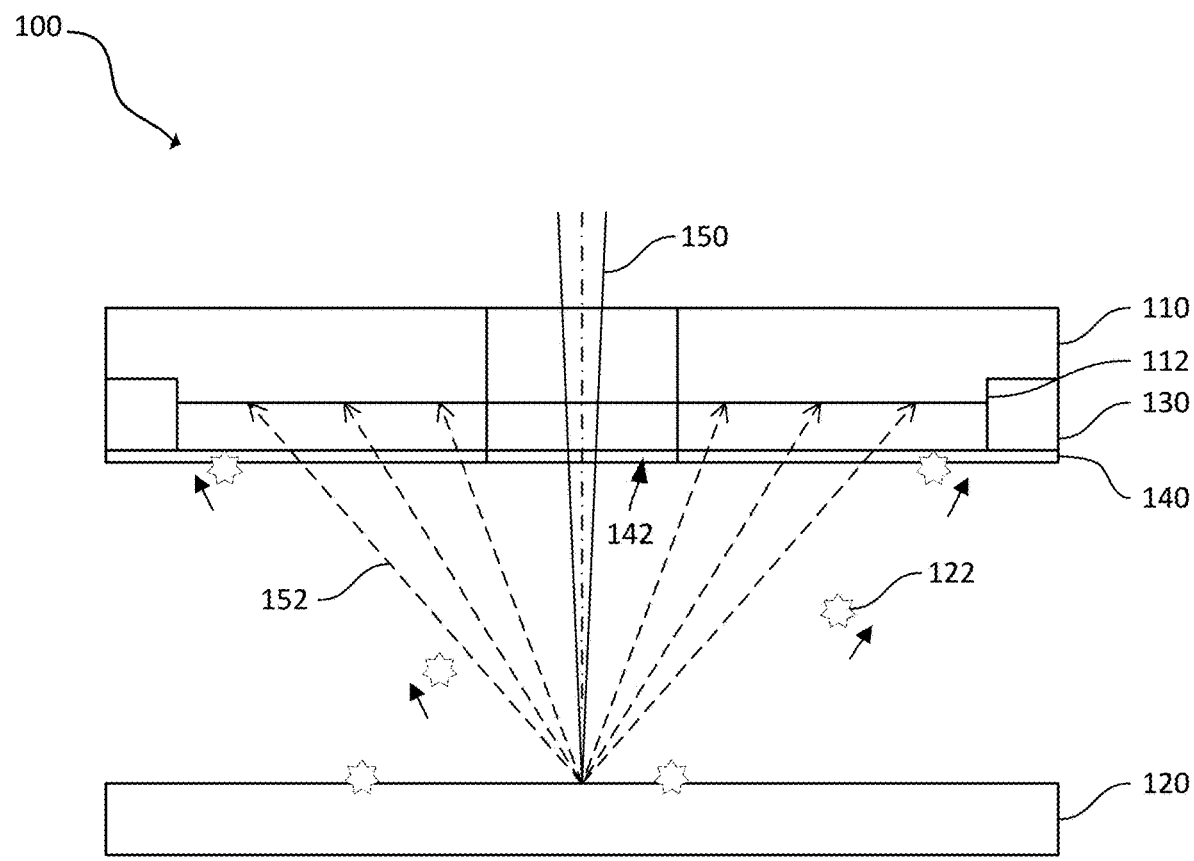
FIG. 1 is a block diagram of a sectional view of a back-scattered electron detector of an embodiment of the present disclosure.

As shown in FIG. 1, an embodiment of the present disclosure may provide a back-scattered electron ("BSE") detector 100.

The BSE detector 100 may comprise a detector face 110. The detector face 110 may be configured to detect back-scattered electrons reflected off of a sample 120, which can be a semiconductor wafer or other type of substrate. For example, when an electron beam 150 is directed at the sample 120, back-scattered electrons 152 may be generated when the electron beam 150 penetrates an atom to its nucleus. The back-scattered electrons 152 may be attracted to the detector face 110 due to a positive bias of the BSE detector 100.

The BSE detector 100 may further comprise an annular cap 130. The annular cap 130 may be comprised of a non-conductive, resilient material. The annular cap 130 may be comprised of rubber, plastic, ceramic, metal, or any other suitable material. The annular cap 130 may be disposed on the detector face 110. For example, the annular cap 130 may be disposed near the edges of the detector face 110. In this way, the annular cap 130 will not cover the active area of the detector face 110 which detects back-scattered electrons 152. The annular cap 130 may be slightly elliptical. Correspondingly, the detector face 110 may have a slightly elliptical shoulder 112 which receives the annular cap 130. The shape of the annular cap 130 may be slightly smaller in both major and minor diameter than the shoulder 112. It can be appreciated that the resilient annular cap 130 may be twisted onto the shoulder 112 of the detector face 110 to be held in place.

The BSE detector 100 may further comprise a protective pellicle 140. The protective pellicle 140 may be disposed on the annular cap 130. For example, the protective pellicle 140 may be stretched or otherwise extended over the annular cap 130. The annular cap 130 may comprise a secondary cap, disposed radially outward from the annular cap 130. The secondary cap may also be annular, and may be slightly elliptical. The shape of the secondary cap may be slightly smaller in both major and minor diameter than the annular cap 130. It can be appreciated that the secondary cap may be twisted onto the annular cap 130 to be held in place. When the protective pellicle 140 is stretched over the annular cap 130, the secondary cap may hold the protective pellicle 140 in place.

Figure 2:
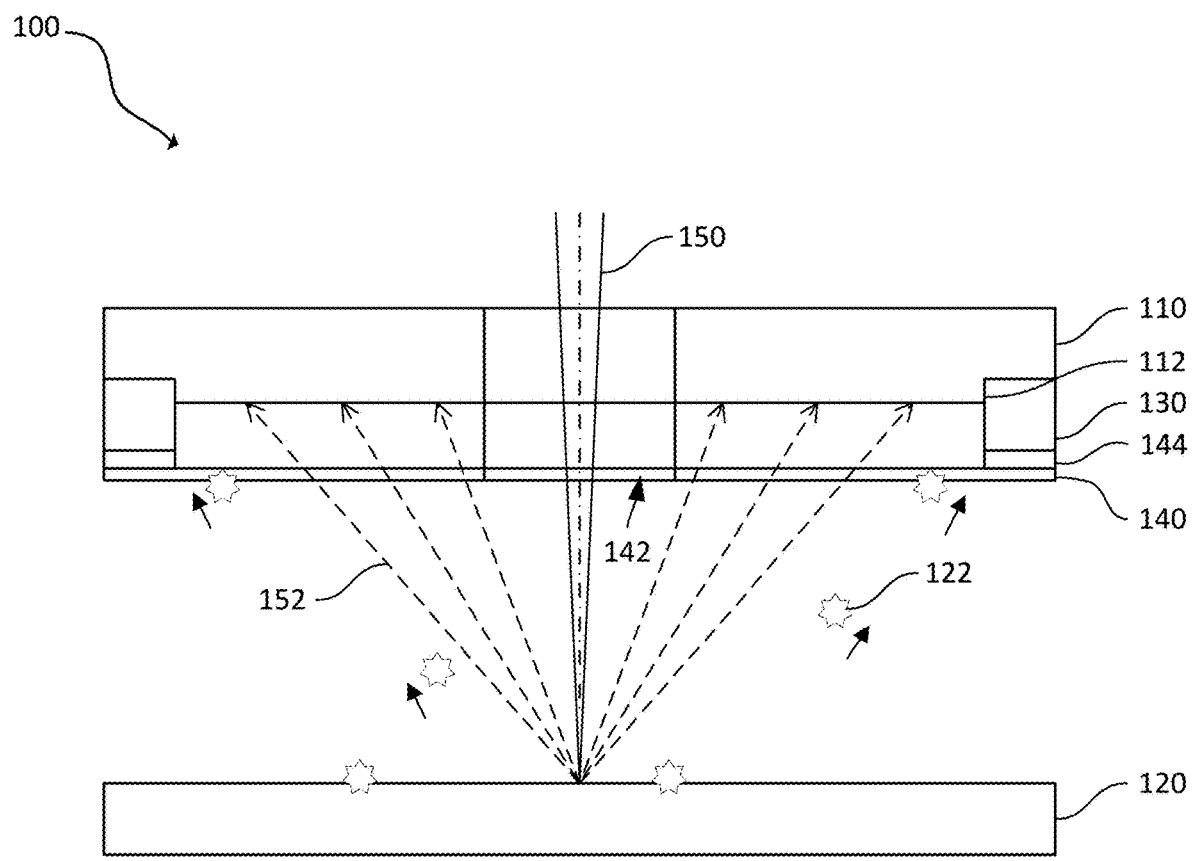
FIG. 2 is a block diagram of a sectional view of a back-scattered electron detector of another embodiment of the present disclosure.

In an instance, shown in FIG. 2, the protective pellicle 140 is positioned on a support frame 144. The support frame 144 can be attached or otherwise fixed on the annular cap 130. The support frame 144 can help maintain a shape of the protective pellicle 140 when it is stretched or otherwise extended over the annular cap 130.

The protective pellicle 140 may cover some or all of the detector face 110 that otherwise would be exposed by the annular cap 130. For example, the protective pellicle 140 may be positioned close to the detector face 110. A distance between the detector face 110 and the sample 120 may be from 1 mm to 50 mm, but smaller and larger distances are possible in some embodiments. The protective pellicle 140 may be positioned at some distance between the detector face 110 and the sample 120. For example, the protective pellicle 140 may be positioned at some fraction of the distance between the detector face 110 and the sample 120. The protective pellicle 140 may be positioned from 99% to 1% of the distance between the detector face 110 and the sample 120, including all values in between. As a non-limiting example, the protective pellicle 140 may be positioned at 50%, 25%, 10%, or 1% of the distance between the detector face 110 and the sample 120, but smaller and larger fractions are possible in some embodiments.

When an electron beam 150 is directed at the sample 120, particles 122 may be generated, being dislodged or delaminated from the sample 120. The particles 122 may be attracted to the detector face 110 due to a positive bias of the BSE detector 100. The particles 122 may be between about 100 µm in size, though other sizes are possible. In this way, the protective pellicle 140 provide a physical barrier to particles 122 discharged from the sample 120 and directed at the detector face 110. Over time, the protective pellicle 140 may collect discharged particles 122, and it may be desirable to replace the protective pellicle 140. It can be appreciated that the protective pellicle 140 and/or the annular cap 130 may be easily replaced in comparison to the other components of the BSE detector 100.

The protective pellicle 140 may be transparent to back-scattered electrons 152. For example, the protective pellicle 140 may not provide a physical barrier to back-scattered electrons 152 directed at the detector face 110. In this way, the BSE detector 100 may be protected from particles 122 discharged from the sample 120, but may still detect back-scattered electrons 152 generated by the sample 120.

The protective pellicle 140 may be monoatomic. The back-scattered electrons 152 may be able to pass through the single layer of atoms of the protective pellicle 140 and reach the detector face 110. For example, the protective pellicle 140 may be graphene or a graphene analog. Inorganic graphene analogs (often referred to as IAGs) are a growing class of two-dimensional nano-sheet materials. These may include boron nitrides, boron carbonnitrides, and transitional metal oxides. The atomic structure of graphene consists of a single layer of carbon atoms arranged in a two-dimensional honeycomb lattice. The bonds between adjacent carbon atoms are strong, and will not break when impacted by discharged particles 122. However, spacing between adjacent carbon atoms allows back-scattered electrons 152 to pass through. While the protective pellicle 140 may be a single atomic layer thick, the protective pellicle 140 also may be more than one atomic layer thick. The protective pellicle 140 may be other materials that exhibit similar transparency to electrons. Thus, a single monoatomic layer of graphene can be used or more than one layer of monoatomic graphene can be used. One or more atomic layers of the graphene analogs also can be used. It can be appreciated that for maximum transparency, materials with low atomic numbers may be desirable to use for the protective pellicle 140.

The surface of the protective pellicle 140 and/or the detector face 110 facing the sample 120 (i.e., perpendicular to the electron beam 150 in FIG. 1) may be various shapes. For example, the surface of the protective pellicle 140 and/or the detector face 110 facing the sample 120 may be round, square, rectangular, hexagonal, or other polygonal shapes. These surface of the protective pellicle 140 and the detector face 110 may be the same shape or different shapes.

The protective pellicle 140 may be an electrical conductor. Particles 122 discharged from the sample 120 may carry a charge, which can cause damage when impacting the detector face 110. Thus, it may be desirable to ground the charge from the particles 122 before they can impact the detector face 110. As an electrical conductor, the protective pellicle 140 may intercept the discharged particles 122 and safely ground the charge to prevent damage to the BSE detector 100. It can be appreciated that graphene is a good electrical conductor, but the protective pellicle 140 may be other materials that exhibit similar electrical conductivity. Certain materials may be good electrical conductors, but are not be desirable to use in a BSE detector 100 due to their effect on the sample 120. For example, materials having a low melting point or a naturally high vapor pressure, such as gold or copper, may not be desirable for use in the BSE detector 100.

In an instance, the protective pellicle 140 and the annular cap 130 may be at Vo, whereas the detector face 110 is biased positively and the sample 120 is biased negatively. Thus, the protective pellicle 140, the annular cap 130, a support frame 144, and/or a secondary cap can be grounded or unbiased to remove charge from the particles 122.

The protective pellicle 140 may be a thermal conductor. Particles 122 discharged from the sample 120 may be high heat, which can cause damage when impacting the detector face 110. Thus, it may be desirable to dissipate heat from the particles 122 before they can impact the detector face 110. As a thermal conductor, the protective pellicle 140 may intercept the discharged particles 122 and safely dissipate the heat to prevent damage to the BSE detector 100. It can be appreciated that graphene is a good thermal conductor, but the protective pellicle 140 may be other materials that exhibit similar thermal conductivity. Certain materials may be good thermal conductors, but are not be desirable to use in a BSE detector 100 due to their effect on the sample 120. For example, materials having a low melting point or a naturally high vapor pressure, such as gold or copper, may not be desirable for use in the BSE detector 100.

According to an embodiment of the present disclosure, the detector face 110 may be annular. In this way, the electron beam 150 may pass through the center of the detector face 110 toward the sample 120. The protective pellicle 140 may include an aperture 142, corresponding to the center of the detector face 110. The aperture 142 may be cut from the protective pellicle 140 using a laser. Other means to cut the aperture 142 from the protective pellicle 140 may be possible. For example, a focused ion beam using a neon or argon beam could be used to cut the aperture 142 from the protective pellicle 140. In this way, the electron beam 150 may also pass through the aperture 142 toward the sample 120. The aperture 142 may have a diameter larger than the width of the electron beam 150, such that the protective pellicle 140 is not in the path of the electron beam 150.

With the back-scattered electron detector 100 of the present disclosure, the protective pellicle 140 may protect the detector face 110 from discharged particles 122, which carry charge and thermal energy. In this way, damage to the detector face 110 may be avoided because the discharged particles 122 can be intercepted by the protective pellicle 140 before they can impact the detector face 110. The protective pellicle 140 may be transparent to back-scattered electrons 152, so the back-scattered electrons 152 generated at the sample 120 may be received by the detector face 110. This may improve the lifespan of the back-scattered electron detector 100 and improve its accuracy.

Figure 3:
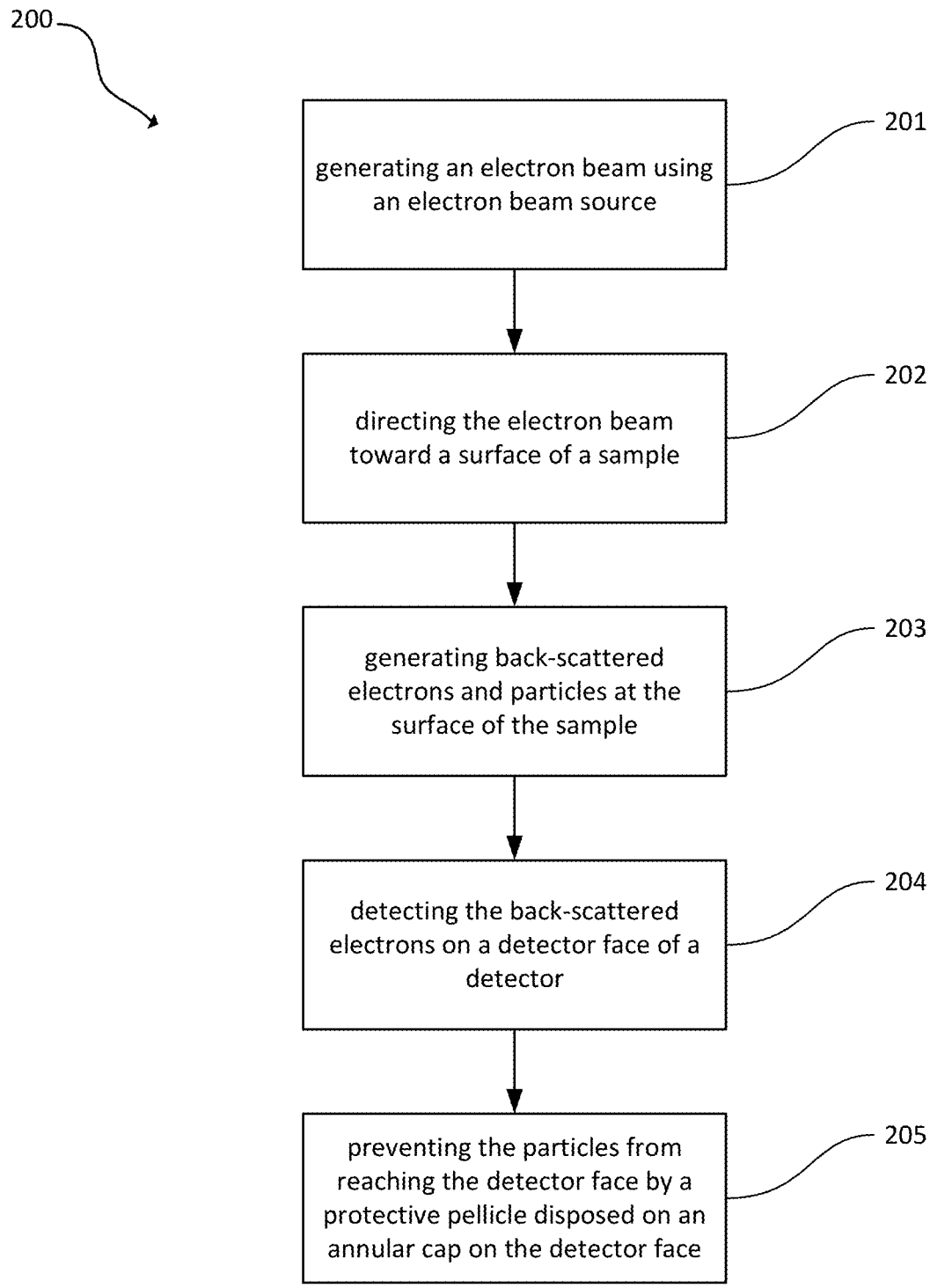
FIG. 3 is a flow chart of a method according to an embodiment of the present disclosure.

As shown in FIG. 3, an embodiment of the present disclosure may provide a method 200. The method 200 may comprise the following steps.

At step 201, an electron beam is generated using an electron beam source. The electron beam source may include, for example, a cathode source or emitter tip.

At step 202, the electron beam is directed toward a surface of a sample. The electron beam may be directed toward the sample at an oblique angle or any other suitable angle. For example, the electron beam may be directed toward the sample at a 90 degree angle.

At step 203, back-scattered electrons and particles are generated at the surface of the sample based on interaction between the electron beam and the sample. When the electron beam penetrates an atom of the sample to its nucleus, back-scattered electrons may be reflected off of the sample. The electron beam may also dislodge or delaminate particles from the sample. The back-scattered electrons and particles may be emitted away from the surface of the sample. The back-scattered electrons and the particles may be emitted from the sample due to a negative bias of the sample.

At step 204, the back-scattered electrons are detected on a detector face of a detector. The detector may be arranged such that back-scattered electrons are directed towards the detector face. For example, when the electron beam is directed toward the sample at an oblique angle, the detector may be arranged at a corresponding angle. When the electron beam is directed toward the sample at a 90 degree angle, the detector may be arranged parallel to the sample. In this configuration, the detector may be annular, allowing the electron beam to pass through its center. The back-scattered electrons may be attracted to the detector face due to a positive bias of the detector. Based on the back-scattered electrons detected by the detector face, imaging of the sample may be achieved.

At step 205, the particles are prevented from reaching the detector face by a protective pellicle. The protective pellicle may be disposed on an annular cap on the detector face. The protective pellicle may be transparent to the back-scattered electrons and provide a physical barrier to the particles directed at the detector face. The particles may be attracted to the detector face due to a positive bias of the detector. In order to prevent damage to the detector caused by the physical impact of the particles, the protective pellicle may provide a physical barrier to the particles.

In order to prevent damage to the detector caused by the electrical charge of the particles, the protective pellicle may be an electrical conductor, configured to carry charge away from the detector. Thus, the method 200 may further comprise draining charge from the particles directed at the detector face intercepted by the protective pellicle.

In order to prevent damage to the detector caused by the thermal energy of the particles, the protective pellicle may be a thermal conductor, configured to dissipate heat away from the detector. Thus, the method 200 may further comprise dissipating heat from the particles directed at the detector face intercepted by the protective pellicle.

According to an embodiment of the present disclosure, the detector may be annular. Thus, step 202 may comprise directing the electron beam toward the surface of the sample through the detector. The protective pellicle may comprise an aperture. Thus, step 202 may further comprise directing the electron beam toward the surface of the sample through the aperture of the protective pellicle.

With the method 200 of the present disclosure, the protective pellicle may protect the detector face from discharged particles, which carry charge and thermal energy. In this way, damage to the detector face may be avoided because the discharged particles can be intercepted by the protective pellicle before they can impact the detector face. The protective pellicle may be transparent to back-scattered electrons, so the back-scattered electrons generated at the sample may be received by the detector face. This may improve the lifespan of the back-scattered electron detector and improve its accuracy.

Figure 4:
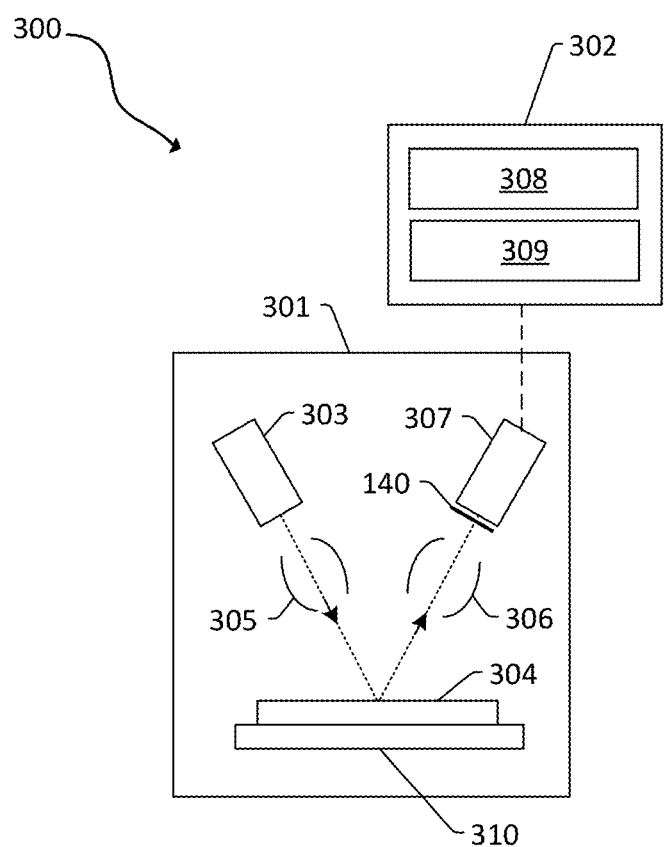
FIG. 4 is a block diagram of an electron beam system of an embodiment of the present disclosure.

FIG. 4 is a block diagram of an embodiment of a system 300. The system 300 includes a wafer inspection tool (which includes the electron column 301) configured to generate images of a wafer 304, which is an example of sample 120.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 4, the output acquisition subsystem includes electron column 301, which is coupled to computer subsystem 302. A stage 310 may hold the wafer 304.

As also shown in FIG. 4, the electron column 301 includes an electron beam source 303 configured to generate electrons that are focused to wafer 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305. A protective pellicle 140, such as that illustrated in FIG. 1, may be provided proximate to the detector 307, before or after the one or more focusing elements 306. The detector 307 can be or include the detector face 110. The protective pellicle 140 may provide a physical barrier to discharged particles from the wafer 304, but may be transparent to the secondary electrons. The protective pellicle 140 may also be an electrical conductor to ground discharged particles, and a thermal conductor to dissipate heat from the discharged particles.

The electron column 301 also may include any other suitable elements known in the art.

Although the electron column 301 is shown in FIG. 4 as being configured such that the electrons are directed to the wafer 304 at an oblique angle of incidence and are scattered from the wafer 304 at another oblique angle, the electron beam may be directed to and scattered from the wafer 304 at any suitable angles. For example, the electron column 301 may be configured such that the electrons are directed to the wafer 304 at a 90 degree angle. In this configuration, the detector 307 may be annular, such that the electrons from the electron beam source 303 may pass through the detector 307 and are reflected back up toward the detector 307. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 as described above. The detector 307 may detect electrons returned from the surface of the wafer 304 thereby forming electron beam images of the wafer 304. The electron beam images may include any suitable electron beam images. Computer subsystem 302 may be configured to generate images of the wafer 304 or perform any of the functions described herein using the output of the detector 307 and/or the electron beam images. A system 300 that includes the output acquisition subsystem shown in FIG. 4 may be further configured as described herein.

It is noted that FIG. 4 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 4 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 302 includes a processor 308 and an electronic data storage unit 309. The processor 308 may include a microprocessor, a microcontroller, or other devices.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The processor 308 is in electronic communication with the wafer inspection tool, such as the detector 307. The processor 308 may be configured to process images generated using measurements from the detector 307.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 308 may be configured according to any of the embodiments described herein. The processor 308 also may be configured to perform other functions or additional steps using the output of the system 300 or using images or data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron beam system comprising:
a detector comprising a detector face configured to detect back-scattered electrons reflected off of a sample;
an annular cap disposed on the detector face; and
a protective pellicle disposed on the annular cap, covering the detector face;
wherein the protective pellicle is transparent to back-scattered electrons and provides a physical barrier to particles directed at the detector face.

2. The electron beam system of claim 1, wherein the protective pellicle is monoatomic.

3. The electron beam system of claim 1, wherein the protective pellicle is graphene or a graphene analog.

4. The electron beam system of claim 1, wherein the protective pellicle is an electrical conductor, configured to drain charge from particles directed at the detector face intercepted by the protective pellicle.

5. The electron beam system of claim 1, wherein the protective pellicle is a thermal conductor, configured to dissipate heat from particles directed at the detector face intercepted by the protective pellicle.

6. The electron beam system of claim 1, wherein the detector face is annular, such that an electron beam passes through the center of the detector face toward the sample.

7. The electron beam system of claim 6, wherein the protective pellicle includes an aperture, such that the electron beam passes through the aperture toward the sample.

8. The electron beam system of claim 1, further comprising:
an electron beam source configured to direct an electron beam toward the sample.

9. A method comprising:
generating an electron beam using an electron beam source;
directing the electron beam toward a surface of a sample;
generating back-scattered electrons and particles at the surface of the sample based on interaction between the electron beam and the sample, the back-scattered electrons and particles being emitted away from the surface of the sample;
detecting the back-scattered electrons on a detector face of a detector;
preventing the particles from reaching the detector face by a protective pellicle, the protective pellicle being disposed on an annular cap on the detector face, transparent to the back-scattered electrons, and providing a physical barrier to the particles directed at the detector face.

10. The method of claim 9, wherein the protective pellicle is monoatomic.

11. The method of claim 9, wherein the protective pellicle is graphene or a graphene analog.

12. The method of claim 9, wherein the protective pellicle is an electrical conductor, and the method further comprises:
draining charge from the particles directed at the detector face intercepted by the protective pellicle.

13. The method of claim 9, wherein the protective pellicle is a thermal conductor, and the method further comprises:
dissipating heat from the particles directed at the detector face intercepted by the protective pellicle.

14. The method of claim 9, wherein detector face is annular, and directing the electron beam toward a surface of a sample comprises:
directing the electron beam toward the surface of the sample through the detector face.

15. The method of claim 14, wherein the protective pellicle includes an aperture, and directing the electron beam toward a surface of a sample further comprises:
directing the electron beam toward the surface of the sample through the aperture of the protective pellicle.

* * * * *